United States Patent
Lin et al.

[11] 3,971,887
[45] July 27, 1976

[54] DYNAMIC MAGNETIC BUBBLE DISPLAY SYSTEM

[75] Inventors: Burn Jeng Lin, Shrub Oak; Yeong Show Lin, Mount Kisco, both of N.Y.

[73] Assignee: International Business Machines Corporation, Armonk, N.Y.

[22] Filed: May 9, 1975

[21] Appl. No.: 575,908

[52] U.S. Cl. .................. 178/7.3 D; 315/169 TV; 340/324 R; 340/337; 340/174 TF; 340/174 YC; 350/151
[51] Int. Cl.² .......................................... H04N 5/66
[58] Field of Search ........... 340/324 R, 337, 324 M, 340/324 R, 174 TF, 174 YC; 315/169 TV; 350/147, 150, 151; 178/7.3 D, 7.5 D

[56] References Cited
UNITED STATES PATENTS

| | | | |
|---|---|---|---|
| 3,460,116 | 8/1969 | Bobeck et al. | 340/174 YC |
| 3,526,883 | 9/1970 | Tabor | 340/174 YC |
| 3,893,023 | 1/1974 | Otala | 340/174 YC |

OTHER PUBLICATIONS
IBM Bulletin, vol. 13, No. 12, May 1971, p. 3718.
IBM Bulletin, vol. 15, No. 7, Dec. 1972, pp. 2213–2216.
IBM Bulletin, vol. 13, No. 1, June 1970, p. 147.

*Primary Examiner*—Robert L. Richardson
*Attorney, Agent, or Firm*—John J. Goodwin

[57] ABSTRACT

A dynamic pattern display and optical data processing system is provided including magnetic bubble devices which may be operated in real-time to produce a multi-tone (gray scale) two dimensional pattern. The display pattern is obtained by directing a light beam, which in certain applications may be linearly polarized, through a plurality of two-dimensional magnetic bubble arrays combined in a stack arrangement. Each magnetic bubble array constitutes a layer which differs in thickness from the other magnetic bubble layers. Each magnetic bubble array is also electronically driven by its own bubble propagating circuit which produces, in most embodiments, a different "local transmissivity" which is determined by whether a bubble or an empty space is propagated to the location. The degree of transmitted intensity is an exponential function of the number of magnetic bubble layers, thus $n$ layers provides $2^n$ steps of transmitted intensity and a four layer structure provides a sixteen tone gray scale display. The electronic portion of the structure may be driven by signals representing mathematical expressions, patterns, manual inputs and the like to generate holograms, holographic complex filters, three-dimensional television pictures, spatial intensity filters, or ordinary two-dimensional multi-tone television pictures.

18 Claims, 6 Drawing Figures

DYNAMIC MAGNETIC BUBBLE DISPLAY SYSTEM

BACKGROUND OF THE INVENTION

1. Field of the Invention

The present invention relates to the field of optical displays and data processing systems and more particularly to optical display and processing systems wherein the transmissivity of light passing through a structure is selectively and dynamically varied in accordance with information signals to produce a desired display pattern.

2. Description of the Prior Art

The IBM Technical Disclosure Bulletin, published by the International Business Machines Corporation, Volume 13 No. 1, June 1970 at pg. 147 contains a publication entitled *Bubble Domain Electronic-To-Optical Image Transducer* by R. M. Craig et al which describes an arrangement of a single bubble domain in combination with a polarizer and an analyzer wherein the optical transparency of the bubbles is controlled by signals to the bubble generators to produce real-time spatial filters.

The present invention is distinct from the prior art in that a plurality of magnetic bubble arrays are combined and are separately electronically driven to produce a multi-tone (gray scale) display.

SUMMARY OF THE INVENTION

An object of the present invention is to provide a display device which can be operated dynamically in real-time and which produces a multi-tone image.

Another object of the present invention is to provide a dynamic display including a plurality of magnetic bubble arrays combined in layers in which the local transmissivity of the arrays can be varied electronically in real time.

A further object of the present invention is to provide a dynamic magnetic-bubble display system for generating and manipulating holograms at electronic speeds.

Another object of the present invention is to provide a magnetic-bubble system for producing spatial intensity filters for real-time optical data processing.

Still another object of the present invention is to provide a magnetic-bubble display system for producing complex spatial filters for real-time optical data processing and for reconstructing three-dimensional video pictures.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1:
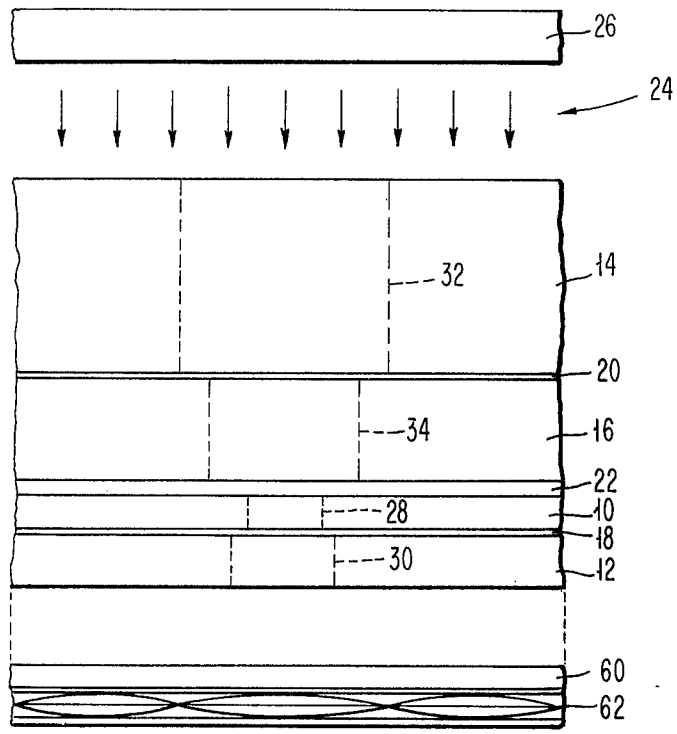
FIG. 1 is a schematic illustration of a side view of an embodiment of a four layer magnetic bubble array used as a sixteen tone display system according to the principles of the present invention.
Figure 2:
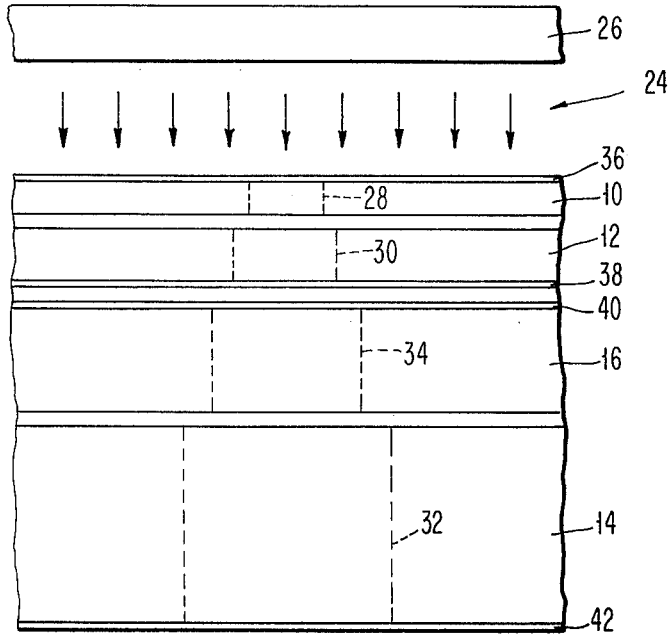
FIG. 2 is a schematic illustration of a side view of another embodiment of a four layer magnetic bubble array used as a sixteen tone display system according to the principles of the present invention.

FIG. 1 is a schematic illustration of a four layer structure of magnetic bubble arrays of unequal thickness which, when linearly polarized light is transmitted therethrough, selectively varies the intensity of the light to produce a sixteen-tone gray scale image. Each magnetic bubble array or layer includes an orthoferrite platelet or garnet or amorphous film structure 10, 12, 14 and 16 and associated propagation circuit layers 18 and 20 contain the permalloy bubble generators and annihilators. Orthoferrite, garnet or amorphous structures 10 and 12 share the same propagation circuit layer 18 and orthoferrite, garnet or amorphous structures 14 and 16 share the same propagation circuit layer 20. That is, propagation layer 18 includes a separate set of permalloy circuits for the magnetic bubbles of structure 10 and 12 and propagation layer 20 includes a separate set of permalloy circuits for the magnetic bubbles of structures 14 and 16. The aforesaid physical arrangement of orthoferrite garnet or amorphous structures sharing propagation circuit layers permits a thinner multilayer arrangement but also requires that the thinnest layer 14 being located between intermediate thickness layers 12 and 16. FIG. 2, to be later discussed, shows a more straightforward arrangement wherein the magnetic bubble layers are arranged in increasing thicknesses and each orthoferrite or garnet structure has a separate current propagation circuit layer. The overall thickness over the structure of FIG. 2 is greater than that of FIG. 1.

In FIG. 1, a gap 22 is provided to separate the orthoferrite, garnet or amorphous structures 12 and 14. Gap 22 may be an airspace or may consist of a layer of quartz of the like. Light 24, which in certain embodiments may be polarized light, is directed through the multilayer structure of FIG. 1 from a suitable source 26. The thicknesses of each of the orthoferrite or garnet bubble structures 10, 12, 14 and 16 are unequal in accordance with selected design parameters and therefore the width of the magnetic bubbles produced in each of the structures 10, 12, 14 and 16 vary in size accordingly. The width of the bubbles in structures 10, 12, 14 and 16 are designated by sections 28, 30, 32 and 34 of FIG. 1.

FIG. 1 also shows an analyzer 60 and a fly's eye lens 62 which are employed in certain applications of the present invention such as embodiments used for spatial intensity filtering and two-dimensional intensity displays. Also, in certain other applications, a single magnifier which covers the entire area of the array is used instead of fly's eye lens 62.

When light is transmitted through magnetic bubbles it is rotated by the Faraday effect, and it is known that the amount of Faraday rotation is proportional to the thickness of the bubble material in accordance with the relationship $\theta = Cl$ where $\theta$ is the angle of Faraday rotation, $l$ is the thickness of the bubble material, and C is a proportional constant. After passing through an analyzer, the intensity of the transmitted light is proportional to sin $\theta$. Thus the amount of Faraday rotation and therefore the intensity of the transmitted light is an exponential function of the thickness of the bubble material in accordance with the expression sin $Cl$. In the present invention, where n layers of selected, unequal thickness bubble material is employed, the intensity of the transmitted light is varied in steps exponentially as a function of $2^n$. Consequently a three layer device provides ($2^3$) eight steps of intensity of an eight tone grey scale. A more effective four layer device provides a sixteen tone grey scale of light intensity.

In FIG. 1, the propagation circuit layers 18 and 20 are responsive to electronic signals and, in accordance with conventional bubble device techniques, generate the independent but related magnetic bubble patterns, in each of the bubble structures 10, 12, 14 and 16.

When the polarized light is transmitted through each of the magnetic bubble structures 10, 12, 14 and 16 the polarization of the light is varied in different amounts in accordance with the particular thickness of the magnetic bubble layer and each magnetic bubble layer contributes a different level of grey scale such that the light passing through the entire multilayer structure of FIG. 1 provides a visual display of the generated pattern having a sixteen tone grey scale. As will be later more fully described, the electronic signals which drive the propagation current circuits 18 and 20 can be dynamically varied to produce changes in the bubble patterns in real time to produce a dynamic or moving display.

Although the dimensions of the various layers of the device of FIG. 1 can be selected for the desired application, it has been found that when orthoferrites are employed as the magnetic bubble material in the case of hologram displays, that thickness values of approximately 35 microns, 55 microns, 100 microns and 180 microns can be used for layers 10, 12, 16 and 14 respectively with propagation circuit layers 18 and 20 being approximately 5 microns thick. These dimensions result in bubble widths of approximately 75 microns, 100 microns, 150 microns and 200 microns for widths 20, 30, 34 and 32 respectively.

FIG. 2 is a schematic illustration of a more straightforward multilayer magnetic bubble device wherein the individual magnetic bubble structures 10, 12, 14 and 16 are arranged in increasing thicknesses. In this arrangement each of the magnetic bubble structures requires a separate propagation current circuit layer 36, 38, 40 and 42. The operating and dimensional characteristics of the device of FIG. 2 are the same as for FIG. 1, with the only difference being in the disposition of the layers, the additional propagation current circuits and, consequently the additional overall thickness of the device.

Figure 3:
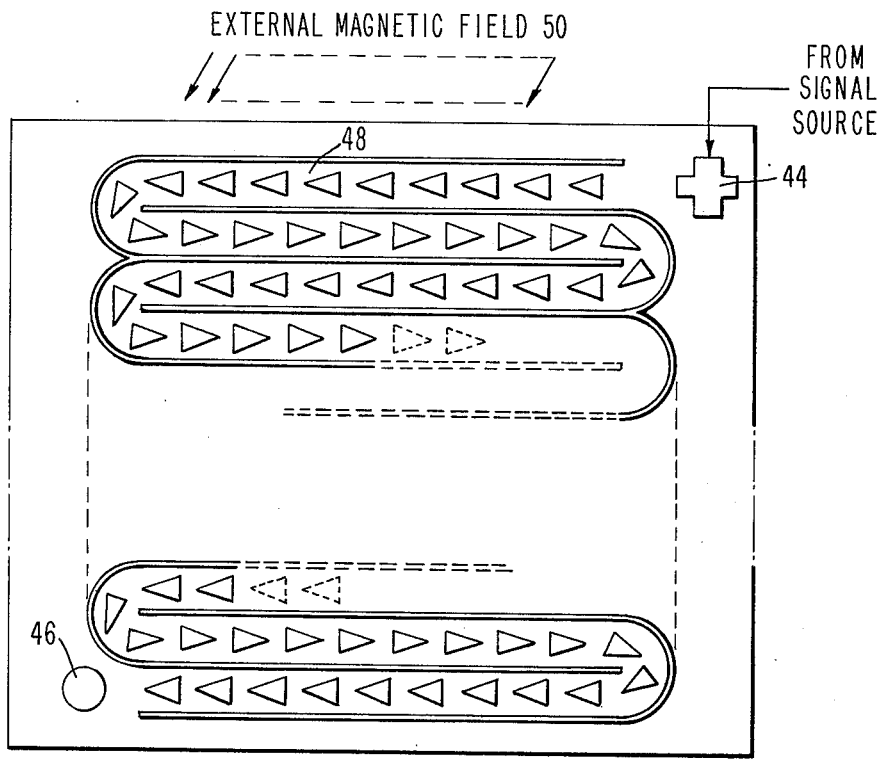
FIG. 3 is a schematic illustration of an angelfish bubble arrangement which may be employed in the present invention.

FIG. 3 is a schematic illustration of one form of magnetic bubble structure and propagation current circuit which may be employed in the device shown in either FIG. 1 or FIG. 2. The magnetic bubble structure illustrated FIG. 3 is generally referred to as an "angel fish" circuit. Angel fish propagation circuits, and magnetic bubble technology in general is described in a publication entitled *Magnetic Bubbles* by Andrew H. Bobeck and H. E. D. Scovil which appears in the June 1971 issue of *Scientific American* pages 75–90. Another descriptive publication is *Application of Orthoferrites to Domain-Wall Devices* by Andrew H. Bobeck et al which appears in *IEEE Transactions on Magnetics*, Vol. MAG 5, No. 3, September 1969, pp. 544–553.

In the angel fish circuit of FIG. 3 a permalloy generator 44, a permalloy annihilator 46 and a permalloy sequence of arrowheads 48 which form a part of the propagation current circuit means 18 or 20 (FIG. 1) are disposed on an orthoferrite magnetic bubble wafer (structure 10, 12, 14, 16, of FIG. 1). An external magnetic field 50 is raised and lowered rhythmically to make the bubbles alternately contract and expand. Each time a bubble contracts it slides off the tip of the trailing arrowhead. With each expansion the bubble slides onto the next arrowhead in line. Each bubble therefore progresses through the total array until it is eliminated by annihilator 46. By proper application of input current to generator 44 a sequence of bubbles can be produced over the entire array of FIG. 3 to produce desired patterns which also can be varied in real time. Because the bubbles must progress through the entire array, and because only one generator and one annihilator are required, the arrangement of FIG. 3 is relatively slow but simple in construction.

Figure 4:
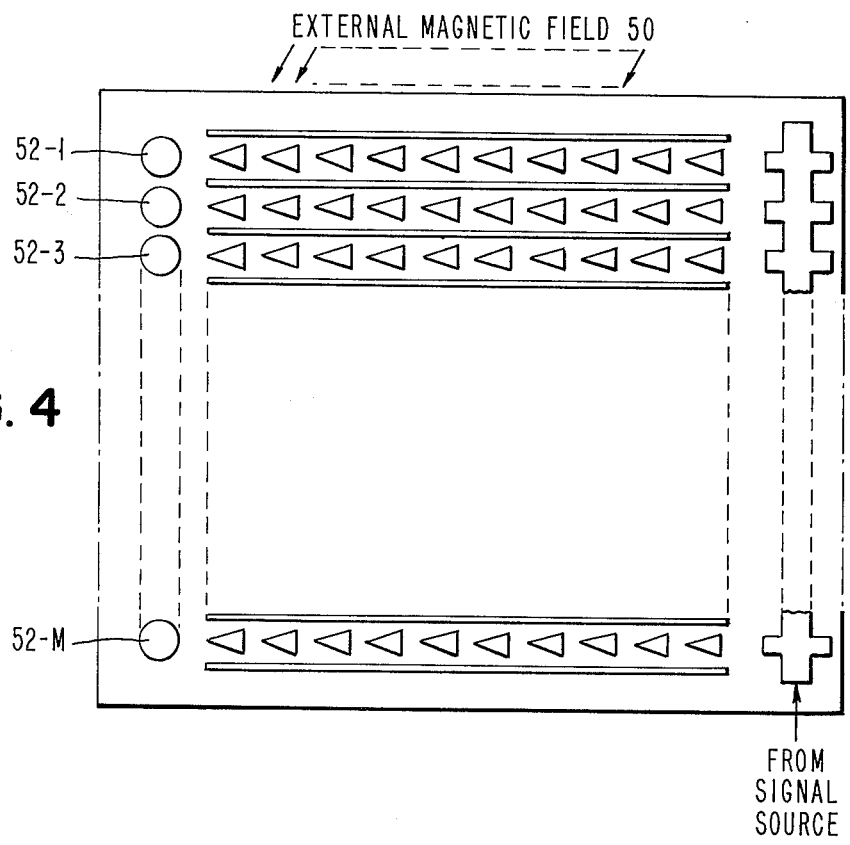
FIG. 4 is a schematic illustration of another angelfish bubble arrangement which may be employed in the present invention.

FIG. 4 illustrates another angelfish bubble arrangement which is faster but slightly more complex than the arrangement of FIG. 3. In FIG. 4 the generator 52 produces bubbles along a plurality of separate lines, each line being terminated with a separate annihilator 52-1 through 52-n. The circuit of FIG. 4 operates on the same principles as that of FIG. 3 except that each line of the pattern is separately generated and the bubbles have to propagate only across the layer rather than through both dimensions of the layer so the arrangement of FIG. 4 results in a faster display.

The arrangements shown in FIGS. 3 and 4 are known prior art configurations which may be employed in the present invention. Other bubble techiniques such as T-bar, Y-bar and the like can also be used in the present invention.

If T-bar propagation circuits are desired, some modification of the multi-layer structures as shown in FIG. 1 and FIG. 2 are suggested. In angel fish circuits the bubbles propagated in different layers run in different directions which for T-bar propagation would require off set scaling in the upper and lower layers of the propagation circuits. An alternate embodiment to those shown in FIGS. 1 and 2 for T-bar propagation would consist of the following. A first layer having an upper propagation circuit and a bubble material such as 36 and 10 in FIG. 2, then a separation layer of silicon dioxide, then a thicker upper propagation layer and bubble material, then another separation layer of silicon dioxide, then a still thicker combination of upper propagation circuit and bubble material, and so on for a total n layer structure.

As previously stated, the present invention may be embodied in a number of different ways to produce a device which can be employed as a holographic spatial complex filter, a spatial intensity filter, a three-dimensional display obtained from a two-dimensional hologram, or a two-dimensional intensity display. The following table sets forth the possible applications and functions of the invention and the elements employed to carry them out.

| Application | Function | Bubble Material | Propagation Circuit | Fly's Eye Lens | Magnifier | Linearly Polarized Filter & Analyzer |
|---|---|---|---|---|---|---|
| Optical Data Processing | Holographic Spatial Complex Filter | Garnet or Amorphous | Angel Fish | No | No | No |
| | Spatial Intensity Filter | Garnet or Amorphous | Angel Fish | No | No | Yes |
| | | | T-1 Bar | No | Yes | Yes |
| Display | Three-Dimensional Display with a Two-Dimensional Hologram | Garnet or Amorphous | Angel Fish | No | Yes or No | No |
| | Two-Dimensional Intensity Display | Ortho-ferrite | Angel Fish | No | No | Yes |
| | | Garnet or Amorphous | T-1 Bar | Yes | No | Yes |
| | | | Angel Fish | No | Yes | Yes |

From the table it can be seen that for optical data processing applications where no human observation is included, the functions of holographic spatial complex filtering and spatial intensity filtering can be performed by the structure of FIG. 1 or FIG. 2 using garnet bubble material for arrays 10, 12, 14 and 16 with angel fish type bubble propagation (or T-1 bar) for spatial intensity filtering, and that no fly's eye lens 62, magnifier linearly polarized filter or analyzer 60 are required. In the case of display systems for human observation the various combinations of elements can be easily determined from the table. One form of display indicated is the three-dimensional display produced by a two-dimensional hologram which is formed by magnetic bubbles using the structure of either FIG. 1 or FIG. 2 wherein the bubbles are propagated according to FIG. 3 or FIG. 4. Magnetic holograms are discussed in the publication *Reconstruction Effects in Magnetic Holography* by Reuben S. Meyrich, *IEEE Transactions on Magnetics*, Vol. MAG 6, No. 3, September 1970, pp. 537 to 541. This publication states that magnetic holography is a storage method based on the combination of techniques of magneto-optics and holography and has features which are unique to either of these techniques, and that reconstruction may be obtained with the Faraday effect, using polarized or unpolarized light with the magnetic hologram behaving like a phase hologram. More particularly, the intensity and phase of the first order diffracted beam which is the reconstructed beam is already modified by Faraday rotations (produced by the magnetic bubbles in the present invention) and is spatially separated from the unmodified zero order beam. Therefore, linearly polarized illumination and a viewing analyzer are not required.

Figure 5:
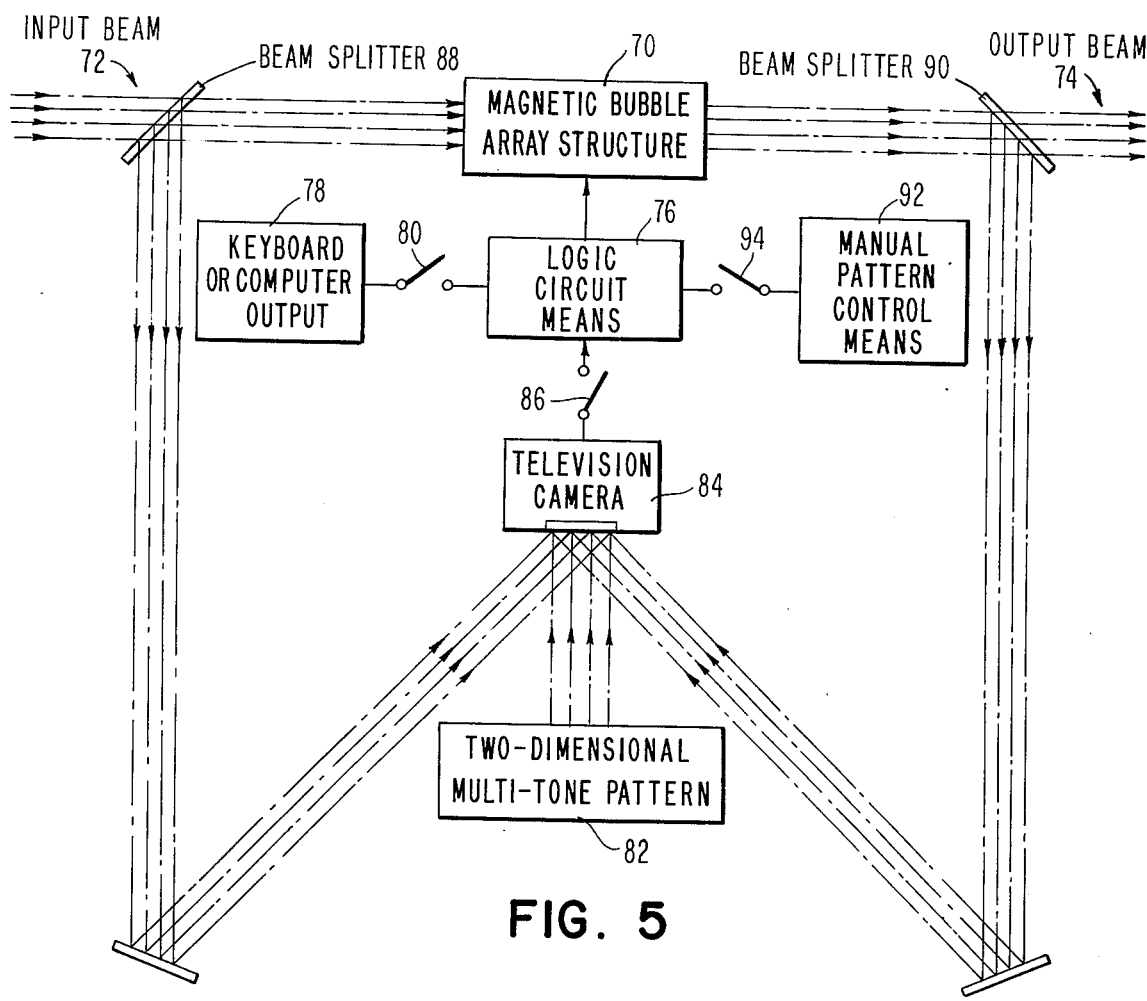
FIG. 5 is a block diagram illustration of an embodiment of an optical data processing system employing the principles of the present invention.
Figure 6:
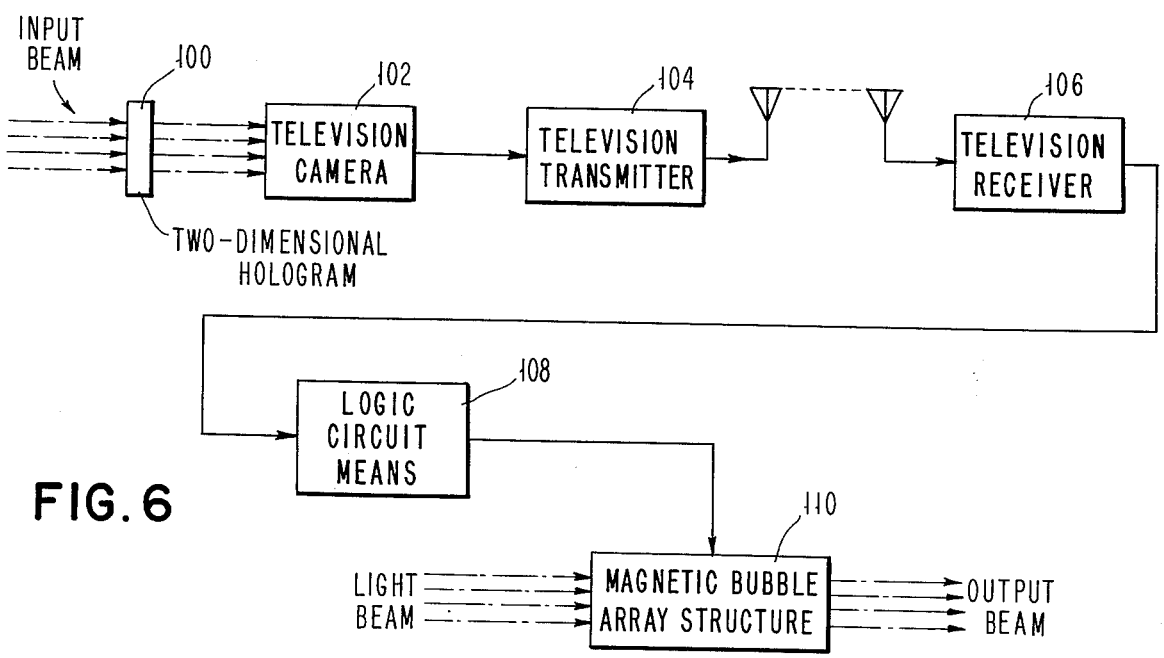
FIG. 6 is a block diagram illustration of an embodiment of a system for three-dimensional video transmission and reception employing the principles of the present invention.

The structures of FIGS. 1 and 2 embodying the propagation schemes of FIGS. 3 and 4 as well as T-bar and Y-bar configurations can be incorporated in systems for optical data processing and display, examples of which are illustrated in the schematic block diagrams of FIG. 5 and FIG. 6.

In FIG. 5 a system is shown employing the magnetic-bubble structure in an optical data processing environment. A magnetic-bubble structure 70 according to FIG. 1 or 2 is disposed in the path of an input light beam 72.

Input beam 72 may or may not have information bearing (image) content depending upon the system application. Input beam 72 is directed through magnetic bubble structure 70, which functions as a spatial complex filter or a spatial intensity filter in a manner to be described, and emerges as an optically processed output beam 74.

The particular type of optical processing perfomed on input beam 72 by magnetic bubble array structure 70 depends on the input signals applied to its bubble generation and propagation circuit. The input signals to magnetic bubble array structure 70 are applied through logic circuit means 76 and are derived from four possible origins. The patterns may be generated by means of a keyboard or from a computer output as represented by block 78. It is well known that patterns such as complex filters can be generated and stored in digital form, and that such digital information signals can be read out and converted into optical form. Thus, by means of block 78 the mathematical expressions for desired patterns can be generated on a keyboard or obtained from a computer and applied through a switch 80 to logic circuit 76 which converts the signals into the proper form to be applied to each of the layers of the magnetic bubble structure 70 to generate and propagate the pattern in the form of a two-dimensional magnetic bubble array which interacts with and optically processes (i.e. spatially or intensity filters) input beam 72 which thereafter can be utilized as output beam 74.

In a second or different mode of operation the pattern to be generated on magnetic bubble array structure 70 may be obtained from a preexisting two-dimensional multi-tone pattern 82. In this mode of operation the pattern 82 is optically detected by a conventional television camera which converts the pattern into an electronic raster video signal which is applied through switch 86 and logic circuit means 76 to drive the bubble generation and propagation means of magnetic bubble array 70 to form a multilayer grey scale bubble configuration of the pattern 82 in a manner described with reference to FIG. 1 and FIG. 2.

It is also possible to operate the system in the second mode such that the pattern 82 applied through television camera 84 to logic circuit means 76 is itself modified or processed, for example by signals from keyboard 78 applied to logic circuit means 76 through switch 80, before it is applied to magnetic bubble array structure 70. Thus, the pattern 82 can undergo electrical signal processing as well as optical signal processing.

In a third mode of operation, a pattern or image carried by input beam 72 may be applied to television camera 84 applies the image in video signal form to logic circuit means 76 which drives the generation and propagation means of magnetic bubble array structure 70 which in turn produces an image of the pattern on input beam 72 in magnetic bubble form which will interact with and process the original image. An example of processing in this mode would be autocorrelation. Again, the video signals representative of the original image may also be modified in logic circuit means 76 by applying a function from keyword 78 such that the original image on input beam 72 is processed by a modified version of the same image in a bubble array configuration in magnetic bubble array structure 70.

Similarly, in a fourth mode, the pattern applied to television camera 84 may be the processed pattern image on output beam 74 which may be obtained and applied back through a beam splitter and may or may not be modified prior to being applied to magnetic bubble array structure 70 by keyboard 78.

From the preceding discussion, it can be appreciated that the pattern produced by magnetic bubble array structure can be obtained not only from input beam 72, keyboard or computer output 78, two-dimensional pattern 82 and output beam 74 applied individually, but also by any combinations of two or more of such sources applied at the same time to form a resultant signal to magnetic bubble array structure 70 modified as desired. For these purposes a scanning optics system such as a rotating mirror can be located in front of television camera 84, the rotation of which is synchronized with the scan rate of the television camera so that combinations of input beam 72 output beam 74 and pattern 82 can be selectively applied to television camera optics system such as a rotating mirror can be located in front of television camera 84, the rotation of which is synchronized with the scan rate of the television camera so that combinations of input beam 72 output beam 74 and pattern 82 can be selectively applied to television camera 84 on a time-shared basis.

An additional feature is incorporated in the system of FIG. 5 as manual pattern control means 92. In certain applications it may be desirable to provide the operator with pattern controls such as vertical shift, horizontal shift, rotation, contraction expansion and the like. Thus, manual pattern control means 92 is provided to selectively apply such suitable signals to the system through switch 94.

The arrangement depicted in FIG. 5, therefore, provides a versatile system for optical processing of an input beam with a number of possible modes of operation to effect a large number of desired results.

Referring to FIG. 6, a system is shown which can provide either a two or three dimensional display listed in the table previously set forth herein. In the system of FIG. 6 an illuminated two dimensional hologram 100 produces an image which is received by a conventional television camera 102 which in turn sends the video signal to a remote location via a conventional television transmitter 104 and television receiver 106. At the remote location the video signals from the television receiver are applied to logic circuit means 108 where they are converted into proper form to be applied to the generation and propagation means for each of the layers of a magnetic bubble array structure 110 similar to those shown in FIG. 1a and FIG. 2. The magnetic bubble array structure 110 responds in a manner previously described to produce a corresponding hologram pattern formed by layers of magnetic bubbles.

A monochromatic polarized light beam which bears no information is directed through the magnetic bubble hologram to produce an output beam which carries a three-dimensional holographic image which can be viewed by an observer.

In the description of FIGS. 5 and 6 the logic circuit means 76 and 108 were described as units which accept electronic signals from keyboard or computer output 78, television receiver 106 and modify the signals such that separate signals in proper form can be applied to the permalloy generators for each of the layers of the multitude of two-dimensional magnetic bubble arrays. Although not shown in specific detail, logic circuit means 76 and 108 as well as keyboard or computer output 78 and manual pattern control means 92 are believed to be either presently available or else well within the skill of a logic circuit design engineer to fabricate.

What has been described are novel optical data processing and display systems which may be operated in realtime to produce multi-tone two dimensional patterns or a three dimensional holographic image. An important feature of the systems is the use of novel two-dimensional magnetic bubble arrays combined in a stack arrangement which produce gray scale patterns. The systems can incorporate various combinations of elements to provide a number of different functions within the optical data processing and display art including spatial complex filtering, spatial intensity filtering, three-dimensional holographic displays and two-dimensional intensity displays.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An optical processing and display device for producing multi-tone display patterns comprising a plurality of separate magnetic bubble array layers arranged in a stack, said magnetic bubble array layers being each of a different thickness, each of said magnetic bubble array layers being composed of material that supports magnetic bubble domains which are movable in predetermined paths in said array, electrical signal means connected to each of said magnetic bubble array layers for selectively propagating magnetic bubble domains through said predetermined paths of said layers, said magnetic bubble domains selectively propagated through said paths of said layers having dimensions proportional to and determined by the thickness of the layers in which they are propagated such that the bubble domains in the separate layers of bubble arrays in said stack are of different predetermined sizes, and means for directing light through said stack of bubble array layers, the intensity of transmission of the light directed through said stack of bubble array layers being varied a different amount by each layer of the bubble domains in each layer in accordance with the thickness of each layer.

2. An optical processing and display device for producing multi-tone display patterns according to claim 1 wherein said light from said light directing means is polarized light and wherein said bubble array layers vary said polarized light by the different local transmissivity of the bubble domains in each layer in accordance with the thickness of each layer.

3. An optical processing and display device according to claim 2 wherein said magnetic bubble array layers have magnetic bubble generators and annihilators associated therewith, said magnetic bubble generators being connected to said electrical signal means for generating magnetic bubble domains in said layers in response to the signals from said electrical signal means.

4. An optical processing and display device according to claim 2 wherein said electrical signal means includes angel fish propagation current circuits.

5. An optical processing and display device according to claim 2 wherein said electrical signal means includes T-bar propagation current circuits.

6. An optical processing and display device according to claim 2 wherein said magnetic bubble array layers are arranged in said stack in progressive thicknesses from the thinnest array at one end to the thickest array at the other end,
and wherein each of said magnetic bubble arrays have a separate electrical signal means connected thereto.

7. An optical processing and display device according to claim 2 wherein said magnetic bubble array layers are arranged in said stack in progressive thicknesses from the center of said stack with the thinnest array being in the middle of the stack,
and wherein pairs of said magnetic bubble arrays are connected to a common one of said electrical signal means.

8. An optical processing and display device according to claim 2 wherein said magnetic bubble array layers are composed of garnet material.

9. An optical processing and display device according to claim 2 wherein said magnetic bubble array layers are composed of orthoferrite material.

10. An optical processing and display device according to claim 2 wherein said magnetic bubble array layers are composed of amorphous material.

11. An optical processing and display device according to claim 2 further including a fly's-eye lens structure disposed at one end of said stack of arrays for viewing the light transmitted therethrough.

12. An optical processing and display device according to claim 2 wherein said light directed through said stack of magnetic bubble arrays is rotated by the Faraday effect in accordance with the thickness of each magnetic bubble layer and is varied in intensity by local transmissivities produced by said Faraday rotation in steps exponentially as a function of $2^n$ wherein is the number of magnetic bubble layers in said stack.

13. An optical processing and display device according to claim 3 wherein a single magnetic bubble generator is connected to each of said magnetic bubble arrays at one corner of each array to selectively produce magnetic bubble domains which move sinuously from said one corner to the diagonally opposite corner of each array to produce a two dimensional magnetic bubble pattern in each array,
and wherein a bubble annihilator is connected to each of said magnetic bubble arrays at said diagonally opposite corner.

14. An optical processing and display device according to claim 3 wherein a plurality of magnetic bubble generators are connected to each of said magnetic bubble arrays along one edge of said arrays to selectively produce magnetic bubble domains which move in rows across each array to produce a two-dimensional magnetic bubble pattern in each array,
and wherein a plurality of bubble annihilators are connected to each of said arrays along the edge of each array opposite said bubble generators and at the end of said rows.

15. An optical processing and display system comprising
a magnetic bubble array structure including a plurality of separate magnetic bubble array layers arranged in a stack, said magnetic bubble array layers being each of a different thickness, each of said magnetic bubble array layers being composed of material that supports magnetic bubble domains which are movable in predetermined paths in said array to produce a two-dimensional pattern of magnetic bubble domains in each array, said magnetic bubble domains selectively propagated through said paths of said layers having dimensions proportional to and determined by the thickness of the layers in which they are propagated such that the bubble domains in the separate layers of bubble arrays in said stack are of different predetermined sizes, and further including magnetic bubble generating means connected to each of said magnetic bubble array layers for selectively propagating magnetic bubble domains through said predetermined paths of said layers,
means for directing polarized light through said stack of bubble array layers, the intensity of transmission of the polarized light directed through said stack of bubble array layers being varied a different amount by each layer by different local transmissivity of the bubble domains in each layer in accordance with the thickness of each layer to produce an optical multi-tone pattern representative of the two-dimensional pattern of said magnetic bubble domains in said layers,
logic circuit means having an output connected to said magnetic bubble generating means for providing electrical signals to said generating means connected to said magnetic bubble layers in said stack to produce patterns of magnetic bubble domains in each of said layers of said stack for varying said polarized light directed through said stack,
and a plurality of signal generating terminals selectively connected to the input of said logic circuit means for individually providing signals to said logic circuit means representative of two-dimensional patterns.

16. An optical processing and display system according to claim 15 wherein one of said signal generating terminals is a computer keyboard terminal capable of producing digital signals representative of two-dimensional patterns in response to key operation by a human operator.

17. An optical and display system according to claim 15 wherein one of said signal generating terminals is a television camera capable of producing electronic video signals representative of two-dimensional patterns presented in optical form to the lens of said camera.

18. An optical processing and display system according to claim 15 wherein one of said signal generating terminals is a manual pattern control means for generating and providing signals to said logic circuit means for modifying the scale and orientation of the two dimensional optical multi-tone patterns produced by said magnetic bubble array structure.

* * * * *